(12) United States Patent
Koyama et al.

(10) Patent No.: US 6,734,621 B2
(45) Date of Patent: May 11, 2004

(54) LIGHT EMITTING DEVICE HAVING MAGNETIZED CATHODE AND ANODE

(75) Inventors: Tomoko Koyama, Suwa (JP); Hiromu Miyazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 15 days.

(21) Appl. No.: 10/235,668

(22) Filed: Sep. 6, 2002

(65) Prior Publication Data
US 2003/0048073 A1 Mar. 13, 2003

(30) Foreign Application Priority Data
Sep. 10, 2001 (JP) ........................................ 2001-273881

(51) Int. Cl.[7] .............................. H05B 33/00; H01J 1/62
(52) U.S. Cl. ........................ 313/503; 313/504; 428/690
(58) Field of Search ................... 313/498, 502, 313/503, 504, 506; 428/690, 917; 315/169.3; 345/45, 76, 86

(56) References Cited

U.S. PATENT DOCUMENTS

| 5,559,400 | A | * | 9/1996 | Nakayama et al. | .......... 313/506 |
| 5,968,675 | A | * | 10/1999 | Tamano et al. | ............. 428/690 |
| 6,284,435 | B1 | * | 9/2001 | Cao | ........................... 430/319 |
| 6,395,409 | B2 | * | 5/2002 | Ueda et al. | ................. 428/690 |
| 6,517,958 | B1 | * | 2/2003 | Sellinger et al. | ............ 428/690 |

FOREIGN PATENT DOCUMENTS

| JP | A 63-070257 | 3/1988 |
| JP | A 63-175860 | 7/1988 |
| JP | A 2-135359 | 5/1990 |
| JP | A 2-135361 | 5/1990 |
| JP | A 3-152184 | 6/1991 |
| JP | A 8-248276 | 9/1996 |
| JP | A 10-153967 | 6/1998 |

OTHER PUBLICATIONS

Shirai, "electronic band–structure, diluted magnetic semiconductor, ferromagnetic material, (Ga, Mn) As, zinc–blende CrAs", Graduate School of Engineering Science, Osaka University, pp. 275–278, 2001.

* cited by examiner

*Primary Examiner*—Ashok Patel
*Assistant Examiner*—Karabi Guharay
(74) *Attorney, Agent, or Firm*—Oliff & Berridge, PLC

(57) ABSTRACT

A light emitting device in accordance with the present invention has a substrate and a light-emitting element section formed on the substrate. The light-emitting element section includes a light-emitting layer, which is capable of generating light by electroluminescence, and an anode and cathode for applying an electrical field to that light-emitting layer. The anode and cathode includes a layer formed of a ferromagnetic material and are also magnetized.

17 Claims, 9 Drawing Sheets

LIGHT EMITTING DEVICE HAVING MAGNETIZED CATHODE AND ANODE

Japanese Patent Application No. 2001-273881, filed on Sep. 10, 2001, is hereby incorporated by reference in its entirety.

BACKGROUND OF THE INVENTION

The present invention relates to a light emitting device that uses electroluminescence (EL).

It is expected, that an EL light-emitting element that employs electroluminescence (EL) will be employed in bright, large-capacity displays. Such an EL light-emitting element would be required to have an even greater light emitting efficiency.

In addition, it is desirable to employ EL light-emitting elements that can be fabricated easily as modulation devices in the communications field, but since the light emitting efficiency of EL light-emitting elements is not yet high enough to enable their application to modulation devices in the communications field, it is difficult to apply EL light-emitting elements to modulation devices in the communications field.

BRIEF SUMMARY OF THE INVENTION

The present invention may provide a light emitting device that makes it possible to achieve a further improvement in light emitting efficiency.

A light emitting device in accordance with the present invention comprises a substrate and a light-emitting element section formed on the substrate; the light-emitting element section comprising:

a light-emitting layer capable of generating light by electroluminescence; and a cathode and anode for applying an electrical field to the light-emitting layer;

wherein the cathode and anode comprise a layer formed of a ferromagnetic material and are also magnetized.

In this case, a ferromagnetic material is a material that is ferromagnetic. Ferromagnetism is a property whereby the positive exchange interaction of magnetic atoms or free atoms of a metal ensure that magnetic moments are aligned in parallel to create spontaneous magnetization.

Note that "the cathode and anode comprise a layer formed of a ferromagnetic material" means either that the entire cathode or anode is formed of a layer of a ferromagnetic material or that part of the cathode or anode is formed of the ferromagnetic material.

An example of an electrode that is formed in part of a ferromagnetic material is an electrode of a multi-layer film of a ferromagnetic material formed on a surface of a layer formed of a paramagnetic material facing the light-emitting layer.

In this case, "the cathode and anode are magnetized" means that a magnetic field acts on the ferromagnetic materials of the anode and the cathode to put the direction of magnetic moments of the atoms within that ferromagnetic materials into an aligned state.

Since the light emitting device in accordance with the present invention makes it possible to align the spin orientation of electrons injected from the cathode as well as the spin orientation of holes injected from the anode, by comprising a layer of a ferromagnetic material within the magnetized anode and cathode, it is possible to increase the probability that singlet excitons will be created among all the excitons that are created. This enables an increase in the light emitting efficiency of the fluorescence. For further details, see the sections on the embodiments of the present invention.

A light emitting device in accordance with the present invention can have any of the aspects set out in (1) to (10) below.

(1) The ferromagnetic material could be a half-metal. In this case, a half-metal is one of these ferromagnetic materials which is completely spin-polarized at the Fermi level.

In this case, "spin-polarized at the Fermi level" is a state in which the number of electrons having an up spin state is different from the number of electrons having a down spin state, and "completely spin-polarized at the Fermi level" means that either the number of electrons having an up spin state or the number of electrons having a down spin state is zero.

(2) The direction of Fermi-level spin polarization in the ferromagnetic material forming the anode and the direction of Fermi-level spin polarization in the ferromagnetic material forming the cathode could be parallel. In that case, the orientation of spin polarization at the Fermi level means the spin orientation of the majority of the electrons in a state of spin polarization, of the electrons at the Fermi level.

(3) The cathode and the anode could be magnetized in the same direction. In such a case, the direction of magnetization of each electrode (the cathode or anode) is the direction in which the entire film that forms that electrode is magnetized, and is the spin orientation of the majority of electrons within those electrons at a state that is lower than the Fermi level.

Alternatively, the cathode and the anode could be magnetized in opposite directions.

(4) The light-emitting layer, the cathode, and the anode could be formed in a stack on the substrate.

(5) The light-emitting layer, the cathode, and the anode could be disposed perpendicular to the surface direction of the substrate. In such a case, the surface direction of the substrate is a direction parallel to the surface of the substrate in contact with the light-emitting element section.

(6) The cathode and anode could be formed of materials such that the work function of the material forming the cathode is less than the work function of the material forming the anode. In this case, the "work function" is the energy required for causing electrons at the Fermi level to move to infinity. The above described configuration makes it possible to reduce power consumption, since it enables a reduction in the drive voltage of the light emitting device.

(7) A layer composed of a non-magnetic material could be formed between the cathode and the anode. Such a configuration would make it possible to transport electrons within the insulating substance in a state in which the spin orientation of the electrons is maintained. This makes it possible to maintain the light emitting efficiency.

In such a case, the layer composed of a non-magnetic material could comprise at least the light-emitting layer. This layer composed of a non-magnetic material could also comprise an electron transportation/injection layer and a hole transportation/injection layer.

(8) The light-emitting layer could comprise an organic light-emitting material that generates light by electroluminescence.

(9) The light-emitting layer could comprise a host material and a guest material, where the host material creates excitons and the guest material is excited by the migration of energy from the excitons to generate light.

(10) The device could further comprise at least one of a hole transportation/injection layer and an electron transportation/injection layer.

The above described light emitting device could be used as a display device. That display device could be applied to an electronic instrument. Alternatively, the above described light emitting device could be applied to an electronic instrument, as described below.

The description now turns to some examples of the materials that can be used in the various parts of the light emitting device in accordance with the present invention. These materials are merely given as a sample of known materials, but of course it is equally possible that various other materials could be selected.

Light-Emitting Layer

The material of the light-emitting layer can be selected from chemical compounds that are known for producing light of a predetermined wavelength. Organic light-emitting materials are preferable as the material of the light-emitting layer, for reasons such as the wide variety thereof and their capability of forming films.

Examples of such organic light-emitting material include aromatic diamine derivatives (TPD), oxydiazole derivatives (PBD), oxydiazoledimer (OXD-8), distyrylarylene derivatives (DSA), beryllium benzoquinolinol complexes (Bebq), triphenylamino derivatives (MTDATA), rubrene, quinacridone, triazole derivatives, polyphenylene, polyalkylfluorene, polyalkylthiophene, azomethine-zinc complexes, porphylin-zinc complexes, benzoxazole-zinc complexes, and phenanthroline-europium complexes, as disclosed by way of example in Japanese Patent Application Laid-Open No. 10-153967.

Various known materials can be used as the material of the light-emitting layer, such as those disclosed in Japanese Patent Application Laid-Open Nos. 63-70257, 63-175860, 2-135361, 2-135359, 3-152184, 8-248276, and 10-153967. These chemical compounds could not only be used alone, two or more of them could be mixed for use.

Hole Transportation/Injection Layer

If a light-emitting layer formed of an organic chemical compound is used in the light-emitting element section, a hole transportation/injection layer could be provided between the anode and the light-emitting layer, if necessary. A hole injection material of a known optically transmissive material could be used as the material of the hole transportation/injection layer, or it could be selected from among known materials used as hole injection layers in organic light emitting devices. The material of the hole transportation/injection layer has the function of either injecting holes or acting as a barrier to electrons, and it can be either an organic or a non-organic material. Specific examples are disclosed in Japanese Patent Application Laid-Open No. 8-248276, by way of example.

Electron Transportation/Injection Layer

If a light-emitting layer formed of an organic chemical compound is used in the light-emitting element section, an electron transportation/injection layer could be provided between the cathode and the light-emitting layer, if necessary. The material of the electron transportation/injection layer could have the function of transferring electrons that have been injected from the cathode into the light-emitting layer, and this material could be selected from known materials. A specific example that could be cited is disclosed in Japanese Patent Application Laid-Open No. 8-248276.

Each layer included in the light emitting device can be formed by known methods. For example, a suitable film formation method could be selected for the layers of the light emitting device, depending on the material properties thereof, such as vapor deposition, spin-coating, Langmuir-Blodgett method, or an ink-jet method.

DETAILED DESCRIPTION OF THE EMBODIMENTS

1. First Embodiment 1.1 Device Structure

Figure 1:
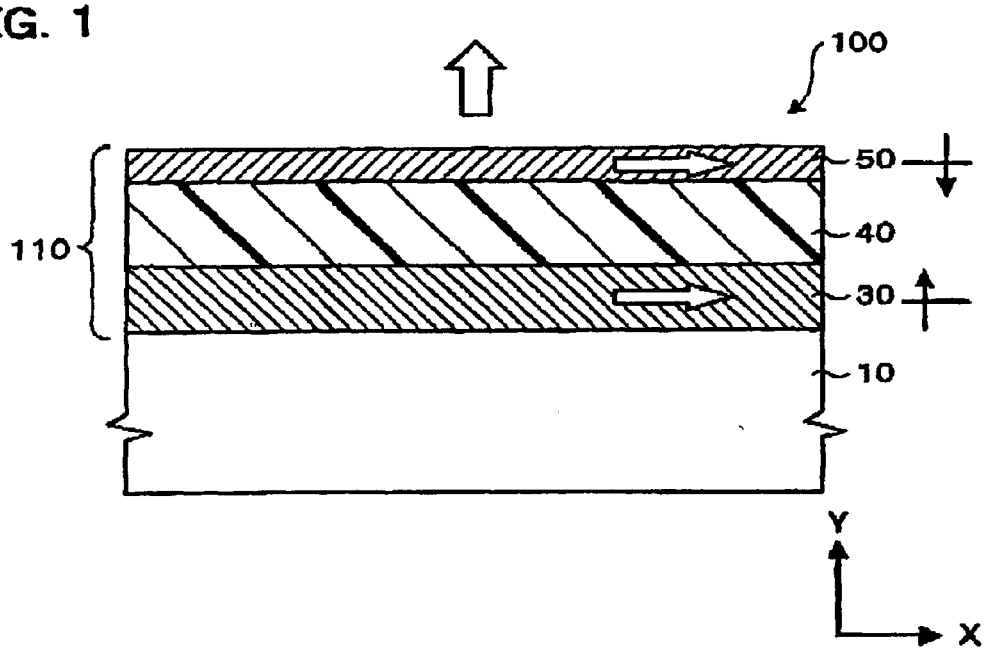
FIG. 1 is a schematic section through a light emitting device in accordance with a first embodiment of the present invention.

A schematic section through a light emitting device 100 in accordance with one embodiment of the present invention is shown in FIG. 1. This light emitting device 100 is used in a display, by way of example.

The light emitting device 100 comprises a substrate 10 and a light-emitting element section 110 formed on the substrate 10. The light-emitting element section 110 comprises an anode 30, a light-emitting layer 40, and a cathode 50. The light-emitting layer 40 is formed of a material that can generate light by electroluminescence (EL). The anode 30 and the cathode 50 are provided in order to apply an electrical field to the light-emitting layer 40.

The anode 30 is formed on the substrate 10. The light-emitting layer 40 is formed between the anode 30 and the cathode 50. Both the anode 30 and the cathode 50 are formed of a ferromagnetic material and are also magnetized. Examples of the ferromagnetic material used for the anode 30 or the cathode 50 include copper, nickel, iron, or alloys thereof.

If the anode 30 and the cathode 50 are magnetized in the direction of the narrow arrow (the x direction) shown on top of each of the anode 30 and the cathode 50 in FIG. 1 in this case, Fermi-level electrons are spin-polarized downward, whereas if they are magnetized in the −x direction, the Fermi-level electrons are spin-polarized upward.

One method of magnetizing the anode 30 and the cathode 50 is to bring a magnetic head into the proximity of the layers that configure the light emitting device 100 (the anode 30, the light-emitting layer 40, and the cathode 50) after forming the layers.

The light-emitting layer 40 is formed of a non-magnetic material.

1.2 Device Operation

The description now turns to the operation and function of this light emitting device 100.

Electrons from the cathode 50 and holes from the anode 30 are each injected into the light-emitting layer 40 by the application of a predetermined voltage to the anode 30 and the cathode 50. Excitons are created within the light-emitting layer 40 by the recombination of these electrons and holes, and light is generated by fluorescence or phosphorescence when those excitons decay. Light that is generated in the light-emitting layer 40 is emitted in the direction of the broad arrow, in other words, in the direction perpendicular to the surface of the substrate 10, and also in the direction from the light-emitting layer 40 to the cathode 50.

1.3 Effects

The description now turns to the effects of the light emitting device 100 of this embodiment.

The description first concerns a typical light emitting device.

If a light-emitting layer formed by using an organic light-emitting material is used as this typical light emitting device, neutral, stable excitons are created when the electrons and holes recombine, and light is generated through these excitons. There are singlet excitons and triplet excitons among these excitons, but usually only fluorescence generated by singlet excitons is employed when the light emitting device by EL is used in an application such as a display.

In a typical light emitting device, the cathode is formed from a material such as that disclosed in Japanese Patent Application Laid-Open No. 8-248276 by way of example, and the anode is formed from a conductive transparent material such as CuI, ITO, $SnO_2$, or ZnO, or from a metal such as gold. If one of these metals or other materials is used in the cathode or anode, the cathode or anode is neither a ferromagnetic material nor also magnetized, so the electrons injected from the cathode and the holes injected from the anode are not aligned in the direction of spin. For that reason, the probability of the generation of singlet excitons, in other words, the internal quantum efficiency, cannot exceed 25% of all the excitons.

In contrast thereto, both the anode 30 and the cathode 50 of the light emitting device 100 of this embodiment are formed of a ferromagnetic material and are also magnetized, so the light emitting efficiency thereof can be increased. The reasons therefor are described below.

The Fermi-level electrons are spin-polarized in the downward direction by magnetizing the anode 30 and the cathode 50 in the X direction, making it possible to inject more downward-oriented electrons or upward-oriented holes. If the anode 30 and the cathode 50 are magnetized in the −X direction, the Fermi-level electrons are spin-polarized in the upward direction, making it possible to inject more upward-oriented electrons or downward oriented holes. Since the light-emitting layer 40 is formed of a non-magnetic material, the electrons can be transferred within the insulating substance in a state in which the direction of spin of the electrons remains unchanged. This makes it possible to maintain the light emitting efficiency. In this manner, it is possible to increase the probability of the generation of singlet excitons to greater than 25% by selectively injecting more upward- or downward-oriented electrons or holes.

As described above, the light emitting device 100 of this embodiment of the invention makes it is possible to align the spin orientation of the electrons injected from the cathode 50 as well as the spin orientation of the holes injected from the anode 30 by ensuring that the anode 30 and the cathode 50 comprise a layer formed of the ferromagnetic material and are also magnetized, so it is thus possible to increase the probability that there will be more singlet excitons among the generated excitons, which makes it possible to improve the light emitting efficiency.

As described previously, the light-emitting layer 40 is formed between the anode 30 and the cathode 50 in the light emitting device 100 of this embodiment. This light-emitting layer 40 is formed of an insulating substance comprising an organic light-emitting material, and this insulating substance is formed of a non-magnetic material. The electrons or holes injected from each electrode are therefore held in a state in which their spin orientation is retained up until the excitons are created, thus achieving the effect of the present invention.

Note that the description above related to an example in which the anode 30 and the cathode 50 are formed of a ferromagnetic material, but it is equally possible to form only part of each electrode of a ferromagnetic material. In such a case, a multi-layer film could be made of an electrode that is configured of a thin film of a ferromagnetic material formed at least on a surface of a layer formed of a paramagnetic material, facing the light-emitting layer side.

In this manner, a material that is generally used as a material for forming an organic EL device can be employed without modification as the material for the electrodes formed of the multi-layer film. It is also possible to ensure that light is emitted in the −Y direction in FIG. 1, by using an electrode that is a transparent ITO layer with a thin film of a ferromagnetic material on the surface as the anode 30 and also configuring the cathode 50 of a material that reflects light. In such a case, it is possible to obtain a device that has an even greater superiority of light emitting efficiency and external extraction efficiency.

In addition, a half-metal could be used as the ferromagnetic material that forms the electrodes (the anode 30 and the cathode 50) of the light emitting device 100 of this embodiment. The half-metal could be used in the fabrication of one or both of the anode 30 and the cathode 50. This configuration would make it possible to inject either electrons or holes in an upward or downward-oriented state into the light-emitting layer 40. This makes it possible to increase the probability of generation of singlet excitons to 50% or more of the total number of excitons.

Various materials could be used as the half-metal, a Heusler alloy such as CdTe or $Cd_{1-x}Mn_xTe$ (where $0 \leq x \leq 1$), or a thin magnetic semiconductor of groups III–V, as disclosed in Applied Physics, Volume 70, No. 3, pages 275 to 278 (2001).

The ferromagnetic material that is used for the anode 30 and the cathode 50 in the light emitting device 100 of this embodiment has been described as having the same direction of magnetization as the direction of spin polarization at the Fermi level, but if the direction of magnetization is opposite to the direction of spin polarization at the Fermi level in either the anode 30 or the cathode 50, it is necessary to magnetize the anode 30 and the cathode 50 in opposite directions.

It is possible to ensure that the light emitting device 100 of this embodiment emits the light generated by the light-emitting layer 40 in the Y direction, as shown in FIG. 1, by setting the film thicknesses of the anode 30 and the cathode 50 suitably. In addition, it is also possible to increase the efficiency with which light is extracted in the Y direction, by providing a component that reflects light between the anode 30 and the substrate 10. Note that it is equally possible to emit light in the −Y direction, by adjusting factors such as the film thickness of the anode 30 and the cathode 50.

It is also possible to make the light generated by the light-emitting layer 40 emit in the surface direction of the substrate 10, by making the film thicknesses of the anode 30 and the cathode 50 sufficiently large, or by forming the anode 30 and the cathode 50 of a material that reflects light, or by providing components that reflect light for both the anode 30 and the cathode 50. In this case, the surface direction of the substrate 10 is parallel to the surface of the substrate 10 in contact with the light-emitting element section 110.

Note that although the description of this embodiment involved the unmodified use of light generated by singlet excitons formed by the light-emitting layer 40, it is also possible to use light generated by energy of singlet excitons formed by the light-emitting layer 40 and moved toward another material. In such a case, the material that initially forms the singlet excitons is called the host material, and the material that is excited by the migration of energy from the singlet excitons into generating light is called the guest material. In other words, the light-emitting layer 40 comprises a host material and a guest material in this case. The light-emitting layer 40 could be formed from Alq doped with DCM2, as an example of the combination of the host material and the guest material. In this case, the Alq functions as the host material and the DCM2 functions as the guest material. Alternatively, the light-emitting layer 40 could be formed of perylene tetracarboxylic dianhydride (PTCDA) doped with pentacene. In that case, the PTCDA functions as the host material and the pentacene functions as the guest material.

The light emitting device 100 of FIG. 1 can also employ the light emitting devices configured by way of example in FIGS. 2 to 4 (described below), by the provision of other layers and by changing the disposition of the light-emitting layer and the electrodes. In these figures, components that are similar to structural elements of the light emitting device 100 of FIG. 1 are denoted by the same reference numbers and further description thereof is omitted.

2. Second Embodiment 2.1 Device Configuration

Figure 2:
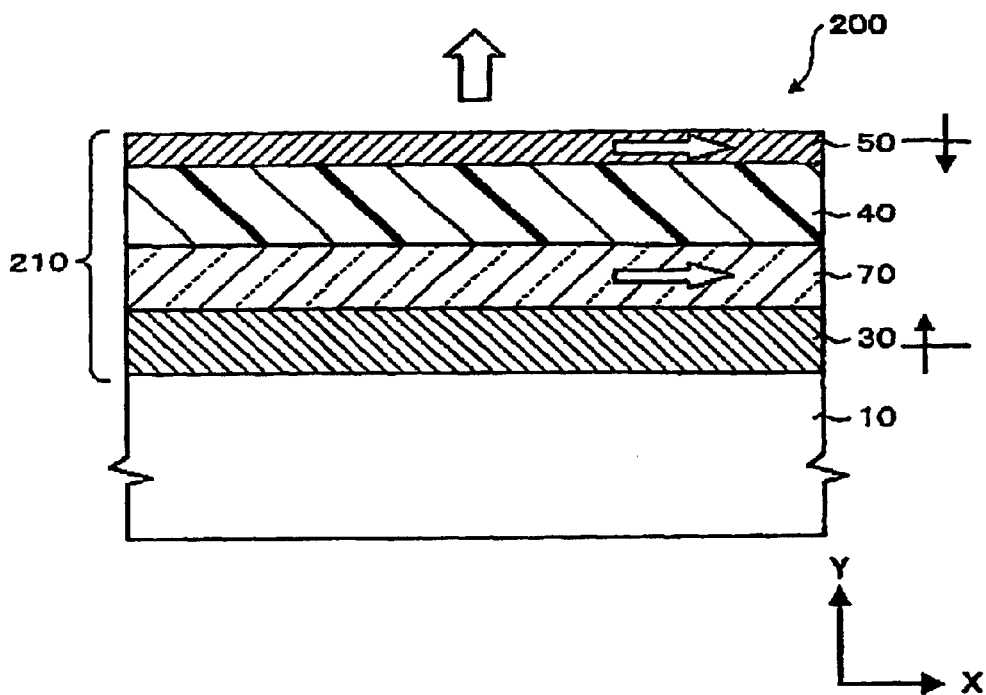
FIG. 2 is a schematic section through a light emitting device in accordance with a second embodiment of the present invention.

A schematic section taken through a light emitting device 200 of a second embodiment is shown in FIG. 2.

The light emitting device 200 of FIG. 2 differs from the light emitting device 100, which is not provided with a hole transportation/injection layer, in that a hole transportation/injection layer 70 is provided in a light-emitting element section 210 thereof.

Specifically, the light emitting device 200 comprises the substrate 10 and the light-emitting element section 210 formed on the substrate 10. The light-emitting element section 210 is formed by depositing the anode 30, the hole transportation/injection layer 70, the light-emitting layer 40, and the cathode 50 in that order on the substrate 10.

2.2 Device Operation and Effects

The description now turns to the operation of this light emitting device 200.

The application of a predetermined voltage to the anode 30 and the cathode 50 makes electrons from the cathode 50 move into the light-emitting layer 40 and holes from the anode 30 move through the hole transportation/injection layer 70 and into the light-emitting layer 40. Excitons are created within the light-emitting layer 40 by the recombination of these electrons and holes, and light is generated by fluorescence or phosphorescence when those excitons decay. The subsequent operation is substantially similar to that of the light emitting device 100 in accordance with the first embodiment, so further description thereof is omitted.

In addition to having effects similar to those of the light emitting device 100 of FIG. 1, the light emitting device 200 can be expected to have an improved hole mobility, due to the provision of the hole transportation/injection layer 70.

3. Third Embodiment 3.1 Device Structure

Figure 3:
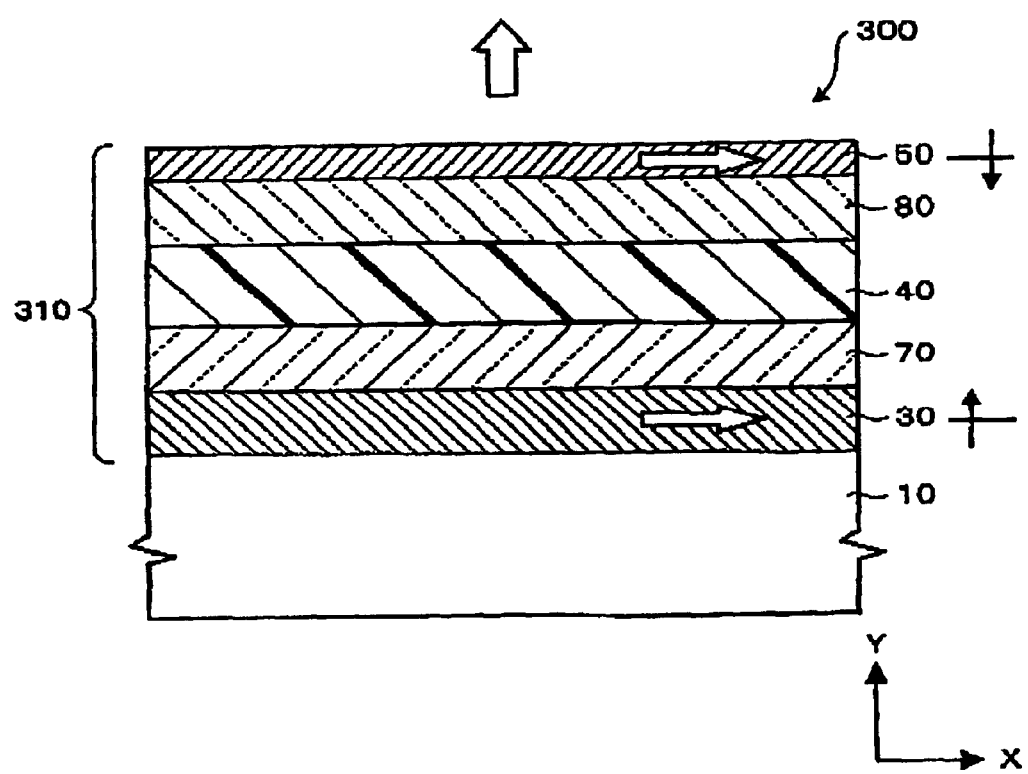
FIG. 3 is a schematic section through a light emitting device in accordance with a third embodiment of the present invention.

A schematic section through a light emitting device 300 in accordance with a third embodiment is shown in FIG. 3.

The light emitting device 300 of FIG. 3 differs from the light emitting device 100 of FIG. 1 in that it comprises the hole transportation/injection layer 70 and an electron transportation/injection layer 80.

Specifically, the light emitting device 300 comprises the substrate 10 and the light-emitting element section 310 formed on the substrate 10. The light-emitting element section 310 is formed by depositing the anode 30, the hole transportation/injection layer 70, the light-emitting layer 40, the electron transportation/injection layer 80, and the cathode 50 in that order.

3.2 Device Operation and Effects

The description now turns to the operation of this light emitting device 300.

The application of a predetermined voltage to the anode 30 and the cathode 50 makes electrons from the cathode 50 move through the electron transportation/injection layer 80 and into the light-emitting layer 40 and holes from the anode 30 move through the hole transportation/injection layer 70 and into the light-emitting layer 40. Excitons are created within the light-emitting layer 40 by the recombination of these electrons and holes, and light is generated by fluorescence or phosphorescence when those excitons decay. The subsequent operation is substantially similar to that of the light emitting device 100 in accordance with the first embodiment.

In addition to having effects similar to those of the light emitting device 100 of FIG. 1, the light emitting device 300 can be expected to have improved hole and electron mobilities, due to the provision of the hole transportation/injection layer 70 and the electron transportation/injection layer 80.

4. Fourth Embodiment 4.1 Device Structure

Figure 4:
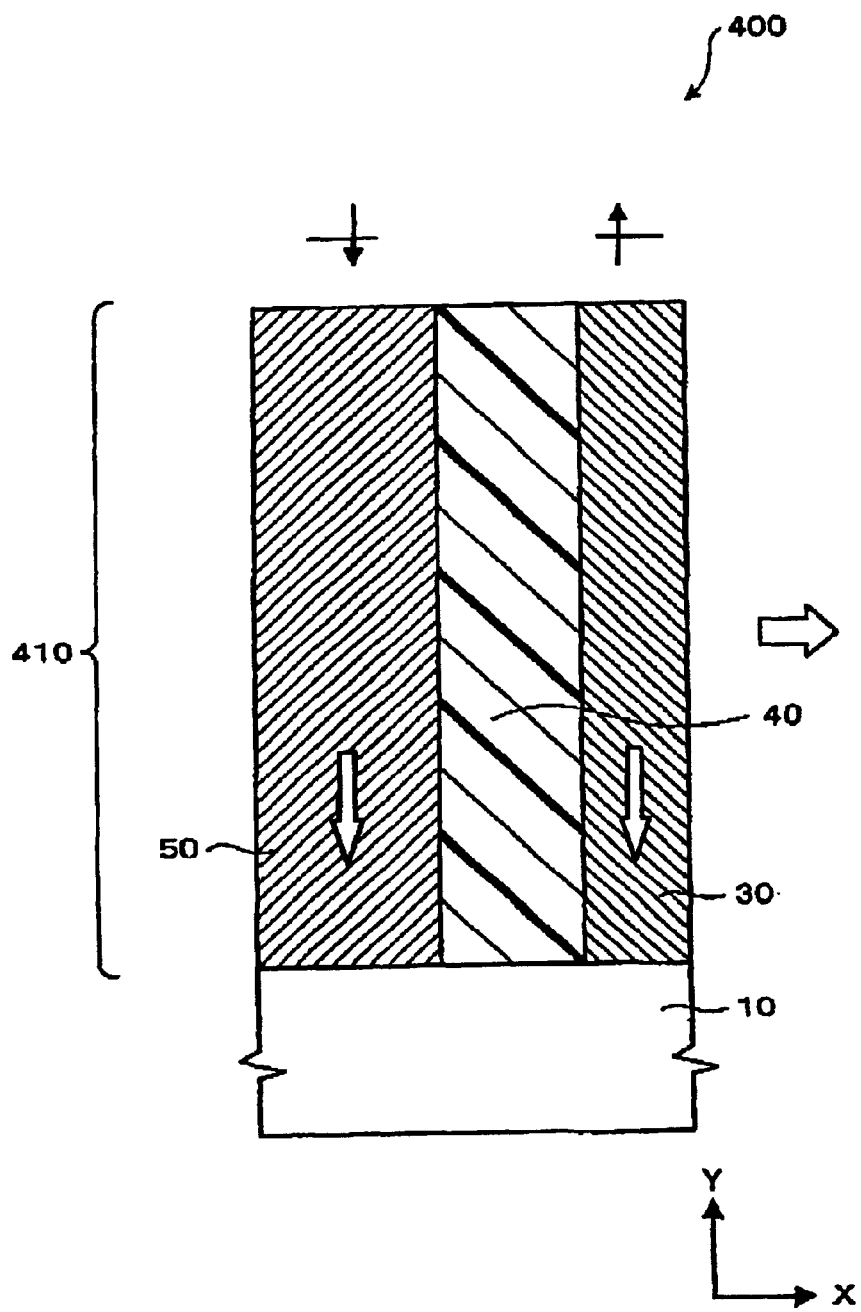
FIG. 4 is a schematic section through a light emitting device in accordance with a fourth embodiment of the present invention.

A schematic section through a light emitting device 400 in accordance with a fourth embodiment is shown in FIG. 4.

The light emitting device 400 comprises the substrate 10 and a light-emitting element section 410 formed on the substrate 10. The light-emitting element section 410 comprises the anode 30, the light-emitting layer 40, and the cathode 50.

The light emitting device 400 of FIG. 4 differs from the light emitting device 100 of FIG. 1 in that all of the light-emitting layer 40 and the pair of electrode layers (the anode 30 and the cathode 50) are disposed perpendicular to the surface of the substrate 10. In other words, whereas the light-emitting layer 40 and the pair of electrode layers (the anode 30 and the cathode 50) are layered on top of the substrate 10 in the light emitting device 100 of FIG. 1, all of the light-emitting layer 40, the anode 30, and the cathode 50 extend in the direction perpendicular to the substrate 10 in the light emitting device 400 of FIG. 4.

4.2 Device Operation and Effects

The operation of this light emitting device 400 is similar to that of the light emitting device of FIG. 1.

The light emitting device 400 also has effects similar to those of the light emitting device 100 of FIG. 1. In addition, it is possible to ensure that the light generated by the light-emitting layer 40 of the light emitting device 400 of this embodiment is emitted only in the x direction, by setting the film thicknesses of the anode 30 and the cathode 50 suitably. For example, it is possible to suppress the emission of light generated in the light-emitting layer 40 in the −x direction from the cathode 50 by increasing the film thickness of the cathode 50. It is also possible to increase the efficiency with which light is extracted in the x direction, by forming the cathode 50 of a material that reflects light, by way of example. Note that it is equally possible to emit light in the −x direction, by adjusting factors such as the film thickness of the anode 30 and the cathode 50.

In the light emitting device 400, both the anode 30 and the cathode 50 have been described as being formed of a material that comprises a ferromagnetic material as the entire electrode, but it is also possible to form only part of each of the anode 30 and the cathode 50 of a ferromagnetic material, as previously described with reference to the light emitting device 100.

5. Fifth Embodiment 5.1 Display Device and Electronic Instrument

A light emitting device in accordance with the present invention, such as the light emitting device 100, 200, 300, or 400 of the various embodiments, can be applied to a display device. A display device comprising one of these light emitting device can be applied to an electronic instrument. Perspective views in FIGS. 5 to 10 are of various examples of electronic instruments to which a display device 500 comprising one of the light emitting devices 100, 200, 300, or 400.

Figure 5:
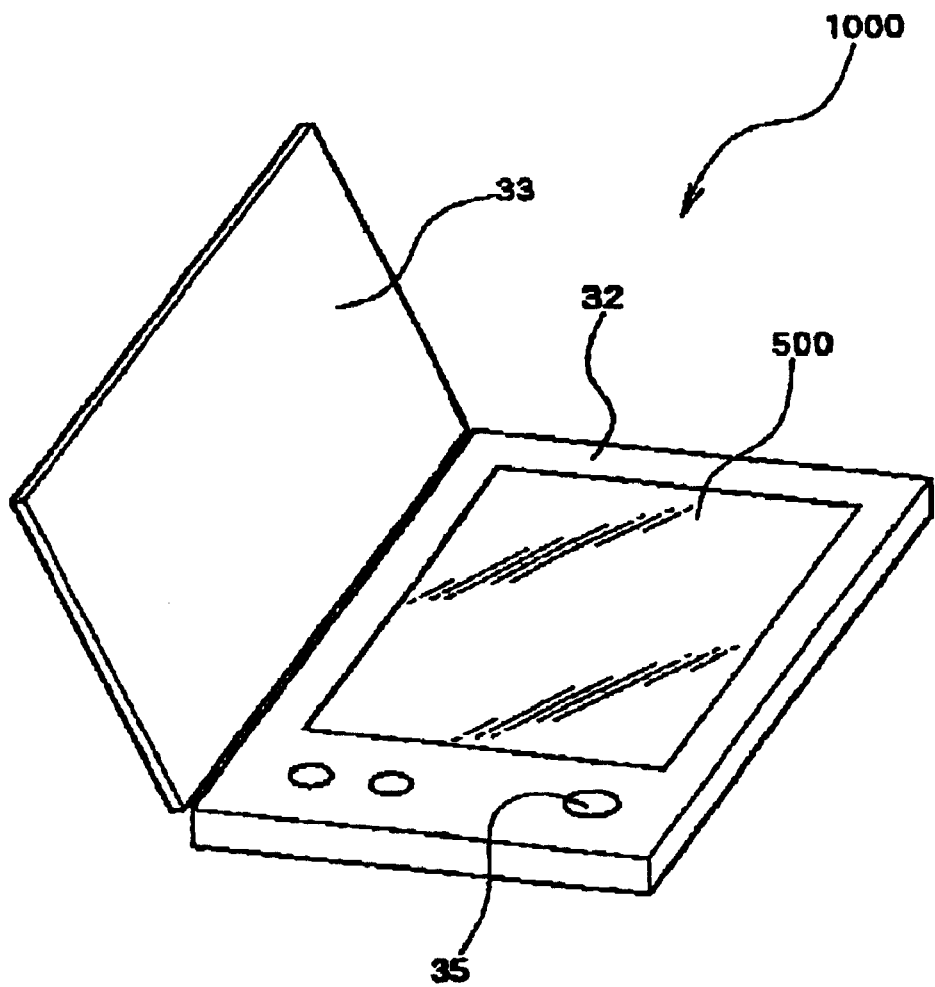
FIG. 5 is a perspective view of the configuration of an electronic book that is an example of an electronic instrument in accordance with a fifth embodiment of the present invention.

FIG. 5 is a perspective view of the configuration of an electronic book 1000 that is an example of an electronic instrument in accordance with this embodiment. The electronic book 1000 comprises a frame 32 in the shape of a book and a cover 33 capable of opening and closing, on the frame 32. The display device 500 is provided in the frame 32 in such a manner that the surface thereof is exposed as a display surface, and an operating section 35 is also provided. Components such as a controller, counter, and memory (not shown in the figure) are incorporated within the frame 32. With this embodiment of the invention, the display device 500 is provided with a pixel portion formed by the injection of electronic ink into thin-film elements and peripheral circuitry (not shown in the figure) which is provided integrally with the pixel portion and is also integrated. This peripheral circuitry is provided with a decoder type of scan driver and a data driver.

Figure 6:
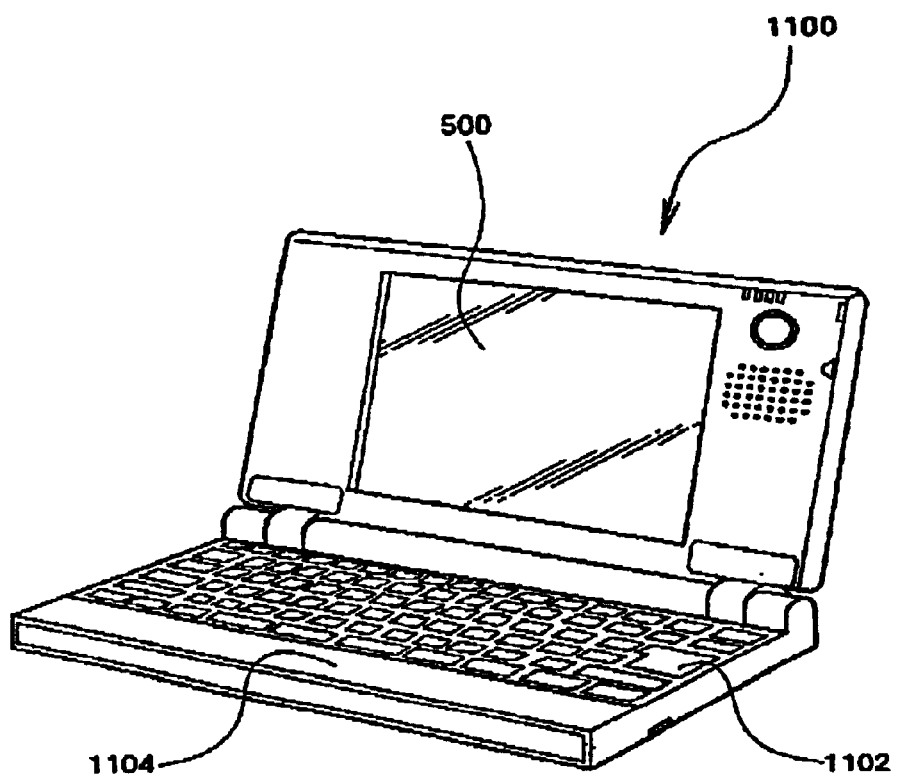
FIG. 6 is a perspective view of the configuration of a personal computer that is another example of an electronic instrument in accordance with the fifth embodiment of the present invention.

FIG. 6 is a perspective view of the configuration of a personal computer 1100 that is another example of an electronic instrument in accordance with this embodiment. This personal computer 1100 is configured of a main body 1104 provided with a keyboard 1102, with a display unit provided with the above described display device 500.

Figure 7:
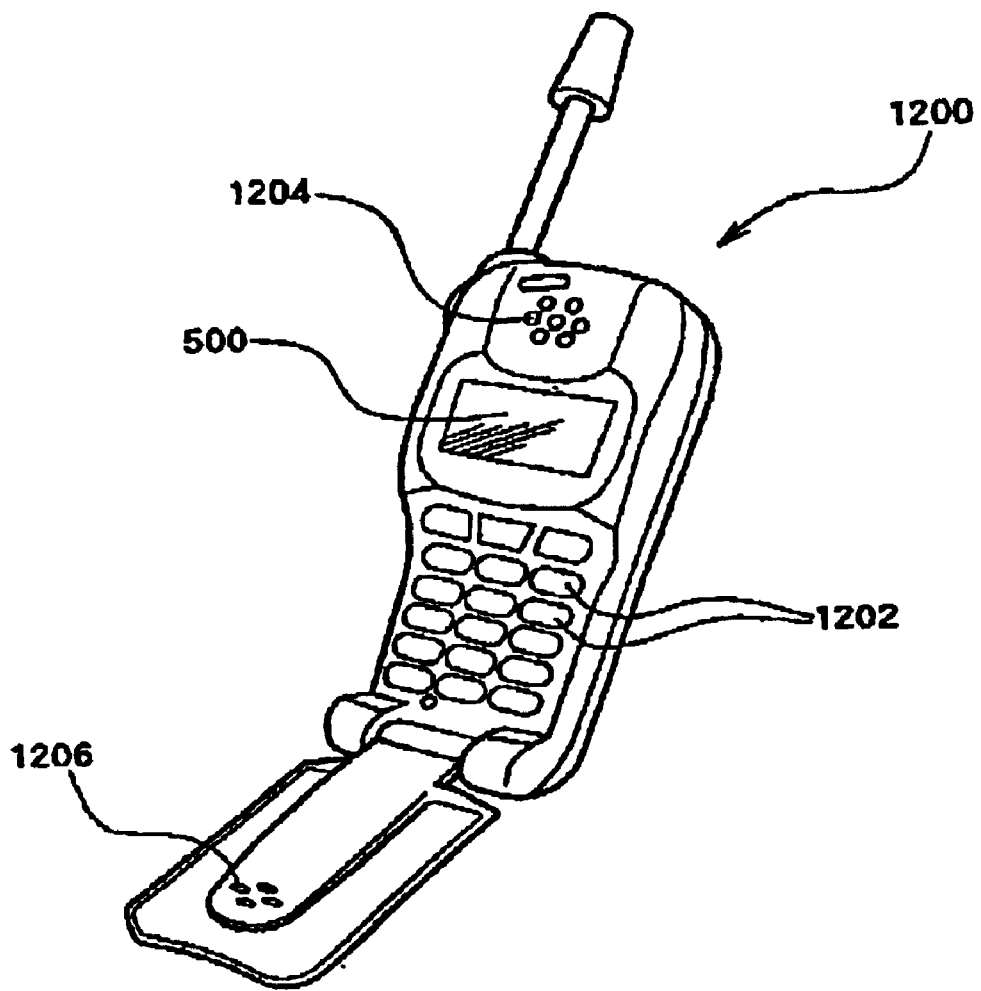
FIG. 7 is a perspective view of the configuration of a portable phone that is yet another example of an electronic instrument in accordance with the fifth embodiment of the present invention.

FIG. 7 is a perspective view of the configuration of a portable phone 1200 that is yet another example of an electronic instrument in accordance with this embodiment. In FIG. 7, the portable phone 1200 is provided with a plurality of operating buttons 1202, a receiver aperture 1204, a transmitter aperture 1206, and also the above described display device 500.

Figure 8:
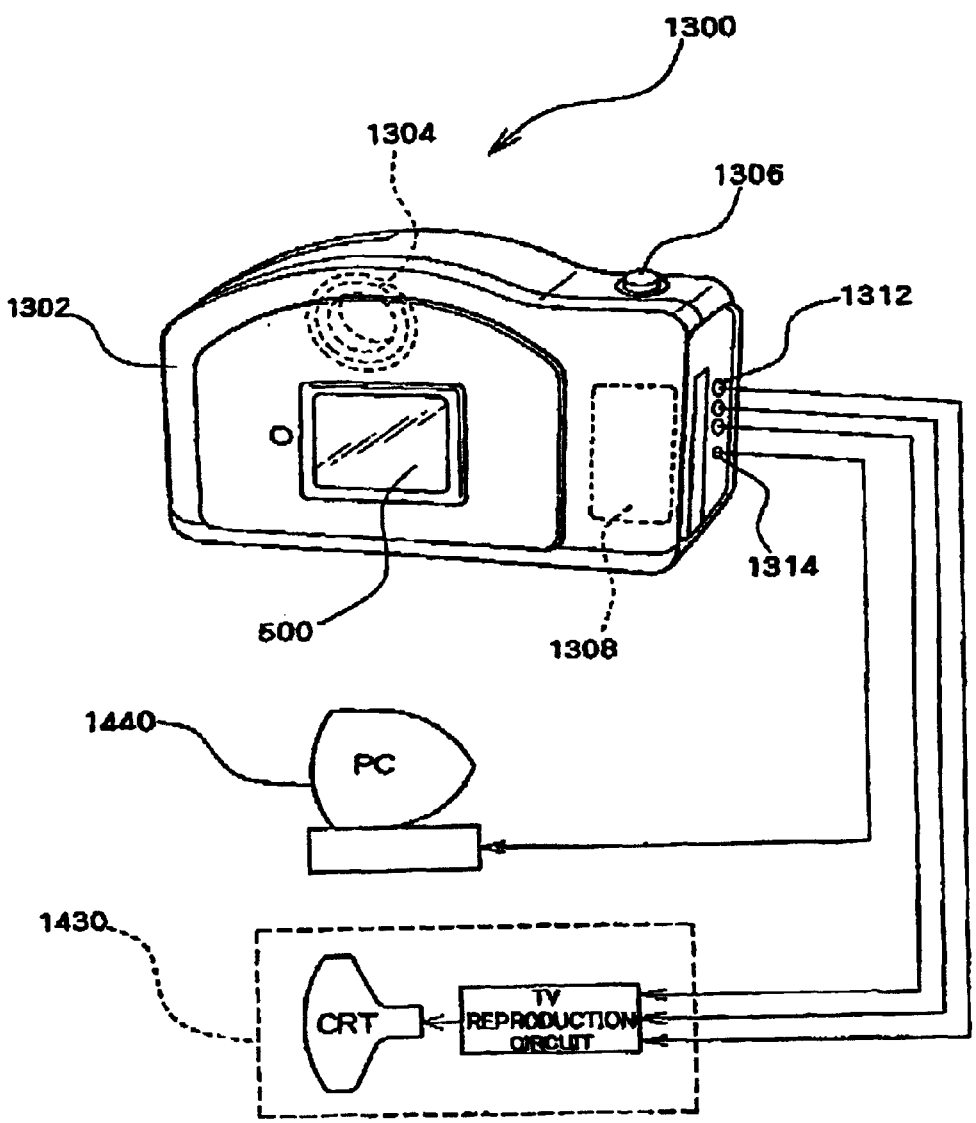
FIG. 8 is a perspective view of the configuration of the rear surface side of a digital still camera that is a further example of an electronic instrument in accordance with the fifth embodiment of the present invention.

FIG. 8 is a perspective view of the configuration of a digital still camera 1300 that is a further example of an electronic instrument in accordance with this embodiment. FIG. 8 shows the configuration of the digital still camera 1300 itself, together with a simplified view of a connection between the digital still camera 1300 and an external device.

In contrast to an ordinary camera which has film that is sensitive to light from the image to be photographed, the digital still camera 1300 generates image signals by the conversion of light by imaging elements of a CCD, according to light from the image to be photographed. In this case, the rear surface of the digital still camera 1300 is provided with the above described display device 500, with the configuration being such that a display is made based on the image signals from the CCD. In other words, the display device 500 functions as a viewfinder that displays the image to be photographed. On a monitor side of a case 1302 (the rear surface side as seen in FIG. 8) is provided a light-receiving unit 1304 comprising components such as an optical lens and a CCD. If the photographer checks the image to be photographed that is displayed on the display device 500 then presses a shutter button 1306, the image signal from the CCD at that instant is transferred to memory on a circuit board 1308 and is stored therein. In this case, the digital still camera 1300 is also provided with a video signal output pin 1312 and an input-output element 1314 for data transfer on a side surface of the case 1302. As shown in FIG. 8, a television monitor 1430 can be connected to the video signal output pin 1312 or a personal computer 1440 can be connected to the input-output element 1314 for data transfer, as required. The configuration is such that image signals stored in the memory on the circuit board 1308 can be output to the television monitor 1430 or the personal computer 1440 by a predetermined operation.

Figure 9:
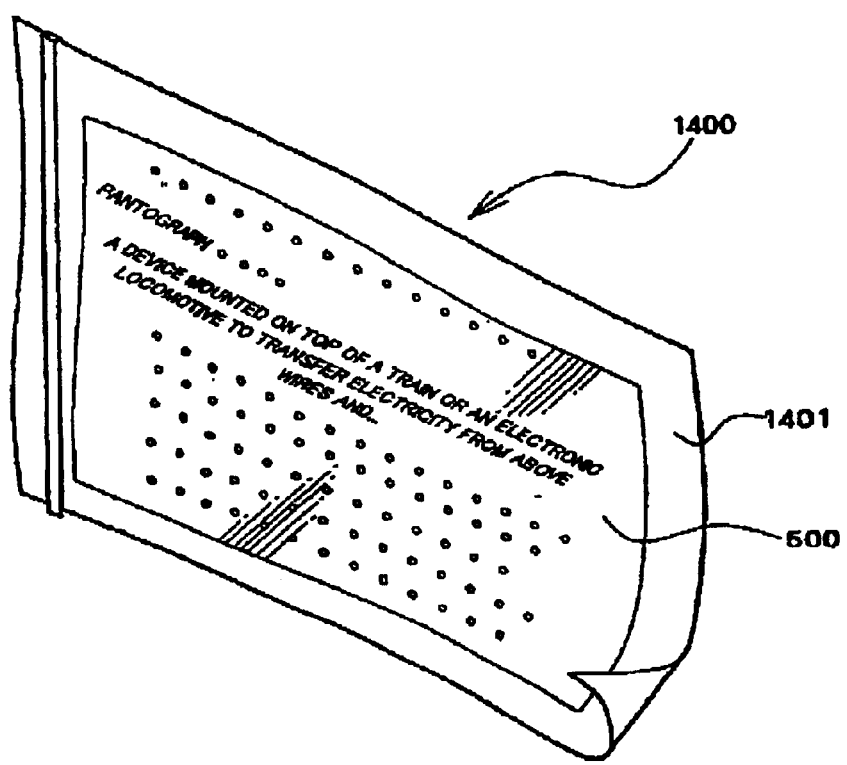
FIG. 9 is a perspective view of the configuration of electronic paper that is a still further example of an electronic instrument in accordance with the fifth embodiment of the present invention.

FIG. 9 is a perspective view of a sheet of electronic paper 1400 that is a still further example of an electronic instrument in accordance with this embodiment. In FIG. 9, the electronic paper 1400 is configured of a main body 1401 formed of a rewritable sheet having a feel and pliability similar to those of paper, together with the above described display device 500.

Figure 10:
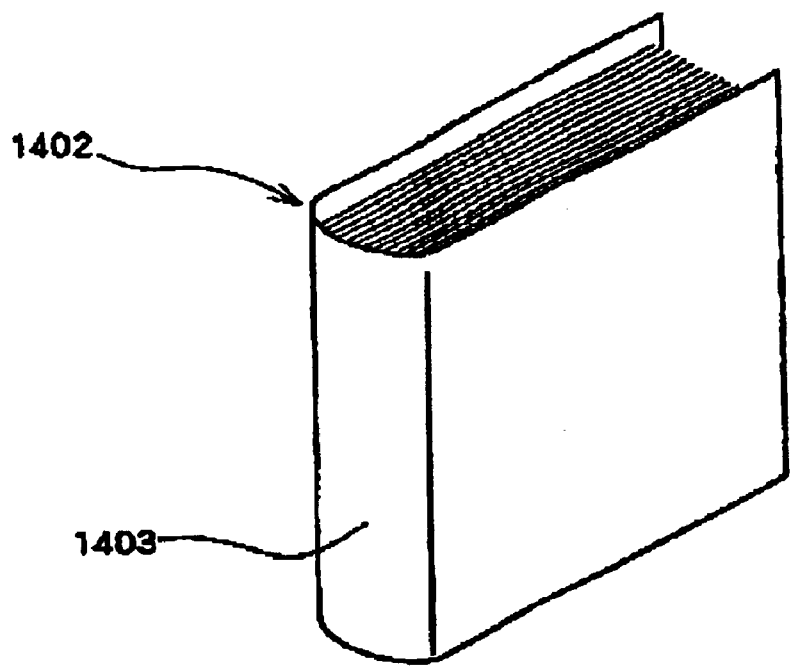
FIG. 10 is a perspective view of the configuration of an electronic notebook that is an even further example of an electronic instrument in accordance with the fifth embodiment of the present invention.

FIG. 10 is a perspective view of an electronic notebook 1402 that is an even further example of an electronic instrument in accordance with this embodiment. In FIG. 10, the electronic notebook 1402 is configured of a bundle of a plurality of sheets of the electronic paper 1400 of FIG. 9, sandwiched within a cover 1403. The electronic notebook 1402 can convert the contents displayed by the electronic paper 1400 in a bundled state, by the provision of a display data input means on the cover 1403.

Note that in addition to the light emitting device 100 of FIG. 5, the personal computer 1100 of FIG. 6, the portable phone 1200 of FIG. 7, the digital still camera 1300 of FIG. 8, the electronic paper 1400 of FIG. 9, and the electronic notebook 1402 of FIG. 10, further examples of the electronic instrument include liquid-crystal televisions, viewfinder-type or direct-monitor-types of video recorders, car-navigation devices, pagers, electronic organizers, calculators, dedicated wordprocessors, workstations, TV phones, POS terminals, IC cards, mini-disc players, and appliances provided with touch panels, it should be obvious to those skilled in the art that the above described display device 500 can be applied as the display section of all of the above types of electronic instrument.

What is claimed is:

1. A light emitting device comprising a substrate and a light-emitting element section formed on the substrate, the light-emitting element section having a light-emitting layer capable of generating light by electroluminescence, and a cathode and an anode for applying an electrical field to the light-emitting layer, and the cathode and the anode having a layer formed of a ferromagnetic material and being magnetized.

2. The light emitting device as defined by claim 1, wherein the ferromagnetic material is a half-metal.

3. The light emitting device as defined by claim 1, wherein the direction of Fermi-level spin polarization in the ferromagnetic material forming the anode and the direction of Fermi-level spin polarization in the ferromagnetic material forming the cathode are parallel.

4. The light emitting device as defined by claim 1, wherein the cathode and the anode are magnetized in the same direction.

5. The light emitting device as defined by claim 1, wherein the cathode and the anode are magnetized in opposite directions.

6. The light emitting device as defined by claim 1, wherein the light-emitting layer, the cathode, and the anode are formed in a stack on the substrate.

7. The light emitting device as defined by claim 1, wherein the light-emitting layer, the cathode, and the anode are disposed perpendicular to the surface direction of the substrate.

8. The light emitting device as defined by claim 1, wherein the work function of the material forming the cathode is less than the work function of the material forming the anode.

9. The light emitting device as defined by claim 1, wherein a layer composed of a non-magnetic material is formed between the cathode and the anode.

10. The light emitting device as defined by claim 9, wherein the layer composed of a non-magnetic material includes at least the light-emitting layer.

11. The light emitting device as defined by claim 1, wherein the light-emitting layer includes an organic light-emitting material that generates light by electroluminescence.

12. The light emitting device as defined by claim 1, wherein:

the light-emitting layer includes a host material and a guest material;

the host material creates excitons; and the guest material is excited by the migration of energy from the excitons to generate light.

13. The light emitting device as defined by claim 1, further comprising:

at least one of a hole transportation/injection layer and an electron transportation/injection layer.

14. The light emitting device as defined by claim 1, wherein the cathode or the anode further includes a layer formed of a paramagnetic material; and wherein the layer formed of a ferromagnetic material is formed on a surface of the layer formed of a paramagnetic material facing the light-emitting layer.

15. A display device using the light emitting device defined by claim 1.

16. An electronic instrument using the display device defined by claim 15.

17. An electronic instrument using the light emitting device defined by claim 1.

* * * * *